US012704543B2

(12) United States Patent
Kim

(10) Patent No.: US 12,704,543 B2
(45) Date of Patent: Aug. 11, 2026

(54) WAFER ANALYZING DEVICE AND WAFER ANALYZING SYSTEM

(71) Applicant: SK hynix Inc., Icheon-si (KR)

(72) Inventor: Tae Beom Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 444 days.

(21) Appl. No.: 18/521,199

(22) Filed: Nov. 28, 2023

(65) Prior Publication Data

US 2025/0052808 A1 Feb. 13, 2025

(30) Foreign Application Priority Data

Aug. 7, 2023 (KR) ........................ 10-2023-0102929

(51) Int. Cl.
*G01R 31/28* (2006.01)

(52) U.S. Cl.
CPC ..... *G01R 31/2831* (2013.01); *G01R 31/2879* (2013.01)

(58) Field of Classification Search
CPC ............ G01R 31/2831; G01R 31/2894; G01R 31/2879
See application file for complete search history.

(56) References Cited

U.S. PATENT DOCUMENTS 6,507,800 B1 * 1/2003 Sheu ........................ H10P 74/23 702/35
2005/0137736 A1 * 6/2005 Lin ..................... H10P 72/0604 700/110
2010/0332208 A1 * 12/2010 Victory ................. G06F 30/367 703/14
2011/0010215 A1 * 1/2011 Lin ........................ G06Q 10/06 702/180
2011/0112999 A1 * 5/2011 Lee ......................... H10P 74/23 706/20
2012/0239178 A1 * 9/2012 Wu ......................... H10P 74/23 700/104
2021/0389754 A1 12/2021 Aronoff

FOREIGN PATENT DOCUMENTS

KR 10-2022-0098898 A 7/2022

* cited by examiner

*Primary Examiner* — Eman A Alkafawi
*Assistant Examiner* — Joseph O Nyamogo

(57) ABSTRACT

A semiconductor wafer analyzing device and semiconductor wafer analyzing system are disclosed that provide estimated analysis values of unit areas that are not measured in a target wafer. The device and system calculate estimated analysis values based on measured analysis values of unit areas in a basic wafer and measured analysis values of some unit areas in the target wafer.

20 Claims, 11 Drawing Sheets

Analysis Value Acquiring Module

Analysis Value Calculating Module

110

120

200

: Unit Area

: Non-Unit Area 504
222
221e
WAT 5 site
221f
WAT 6 site
221i
WAT 9 site
503
222
221d
WAT 4 site
WAT 1 site
WAT 2 site
221b
221a
502
221h 222
WAT 8 site
WAT 7 site
501
221g
222
WAT 3 site
221c 221e
504
222
221i
221f
503
222
221d
221b
221a
502
221h 222
501
222
221g
221c
WAT 1 site
WAT 2 site
WAT 3 site
WAT 4 site
WAT 5 site
WAT 6 site
WAT 7 site
WAT 8 site
WAT 9 site
3(1 to 4site)
3(1 to 2site)
2(5 to 6site)
2(3 to 7site)

801a
802a
801b
802b
801c
802c

1site-2site average value
10.653
Via4 WAT
Diff from average value
10.566
-0.8%
10.724
0.7%
10.789
1.3%
10.813
1.5%
10.741
0.8%
WAT 1 site
WAT 2 site
WAT 3 site
WAT 4 site
WAT 5 site
WAT 6 site
WAT 7 site
WAT 8 site
WAT 9 site
901
221a
221b
222

1100
Analyzing Device
1200
Testing Device
1300
Verifying Device
R2 = 0.2687
Analysis Value
Defect percentage, %
0.2
0.22
0.24
0.26
0.28
0.3
0.32
0.34
0%
10%
20%
30%
40%
50%
60%

WAFER ANALYZING DEVICE AND WAFER ANALYZING SYSTEM

CROSS-REFERENCE TO RELATED APPLICATION

The present application claims priority under 35 U.S.C. § 119(a) to Korean Patent Application No. 10-2023-0102929 filed in the Korean Intellectual Property Office on Aug. 7, 2023, which is incorporated herein by reference in its entirety.

BACKGROUND

1. Technical Field

Various embodiments of the present disclosure generally relate to a wafer analyzing device and a wafer analyzing system.

2. Related Art

A wafer analyzing device may perform inspection on a wafer to acquire analysis values, and may use the analysis values to provide information that enables the analysis of yield or defects in semiconductors manufactured on the wafer.

For example, the wafer analyzing device may perform inspections on a plurality of areas of the wafer after the manufacture of the semiconductors is completed. Based on the results of the inspections conducted on the plurality of areas of the wafer, the wafer analyzing device may analyze the characteristic distribution of the wafer, and may provide information for checking the yield or detecting defects in the semiconductors.

To ensure the accuracy of analysis results provided by the wafer analyzing device, it is necessary to inspect a plurality of areas of the wafer. However, a challenge arises in that it is difficult to perform inspections on all these areas across numerous wafers.

SUMMARY

Various embodiments of the present disclosure are directed to providing measures capable of providing analysis values that enable accurate analysis of the yield and defects in semiconductors manufactured on a plurality of areas of a wafer and that facilitates the identification of the causes of defects.

In an embodiment, a wafer analyzing device may include: an analysis value acquiring module configured to obtain first measured analysis values for an integer N number of unit areas included in a first wafer, and obtain second measured analysis values for an integer K number of reference unit areas, from among an N number of unit areas included in a second wafer, wherein N>K≥2; and an analysis value calculating module configured to classify a plurality of remaining unit areas included in the second wafer, wherein the plurality of remaining unit areas includes up to an (N−K) number and excludes the K number of reference unit areas, into a K number of groups, and configured to calculate an estimated analysis value for each of the up to (N−K) number of the plurality of remaining unit areas using the first measured analysis values for the integer N number of unit areas from the first wafer and the second measured analysis values for an integer K number of reference unit areas from the second wafer.

In an embodiment, a wafer analyzing device may include: an analysis value acquiring module configured to acquire an integer P number of first measured analysis values for a P number of unit areas from among an integer N number of unit areas included in a first wafer, and to acquire an integer K number of second measured analysis values of a K number of unit areas from among an N number of unit areas included in a second wafer, wherein N≥P≥2 and P>K; and an analysis value calculating module configured to calculate an estimated analysis value for each of an (N−K) number of unit areas in the second wafer, excluding the K number of unit areas having measured analysis values, based on the P number of first measured analysis values from the first wafer and the K number of second measured analysis values from the second wafer.

In an embodiment, a wafer analyzing system may include: an analyzing device configured to provide an analysis value for each of an N number of unit areas included in a target wafer; a testing device configured to perform a test on a plurality of semiconductor chips disposed respectively on the N number of unit areas included in the target wafer, and to provide a defect percentage for each of the N number of unit areas included in the target wafer according to the tests; and a verifying device configured to extract a cause of a defect associated with the tests based on a correlation between the analysis value of each of the N number of unit areas in the target wafer and the defect percentage of each of the N number of unit areas in the target wafer.

According to the embodiments of the present disclosure, it is possible to easily provide analysis values that enables accurately analyzing the yield and defect causes of semiconductors manufactured on a plurality of areas of a wafer while reducing the number of inspections conducted on the plurality of areas.

BRIEF DESCRIPTION OF THE DRAWINGS

FIG. 1 is a diagram illustrating an example of a wafer analyzing device configuration according to an embodiment of the present disclosure.

DETAILED DESCRIPTION

Figure 2:
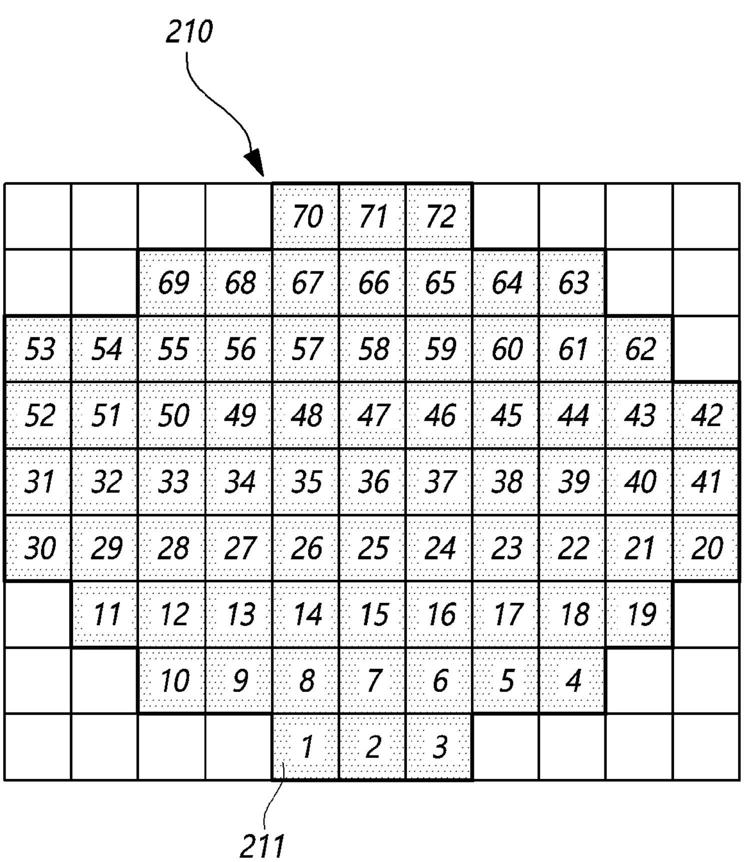
FIG. 2 is a diagram illustrating an example of a first wafer analyzed by a wafer analyzing device according to an embodiment of the present disclosure.

In the following description of examples or embodiments of the present disclosure, reference will be made to the accompanying drawings in which it is shown by way of illustration specific examples or embodiments that can be implemented, and in which the same reference numerals and signs can be used to designate the same or like components even when they are shown in different accompanying drawings. Further, in the following description of examples or embodiments of the present disclosure, detailed descriptions of well-known functions and components incorporated herein will be omitted when the description may make the subject matter in some embodiments of the present disclosure rather unclear. Terms such as “including”, “having”, “containing”, “constituting” “made up of”, and “formed of” used herein are generally intended to allow other components to be added unless the terms are used with the term “only”. As used herein, singular forms are intended to include plural forms unless the context clearly indicates otherwise.

Terms, such as “first”, “second”, “A”, “B”, “(A)”, or “(B)” may be used herein to describe elements of the present disclosure. Each of these terms is not used to define essence, order, sequence, or number of elements etc., but is used merely to distinguish the corresponding element from other elements.

When the description includes a first element that “is connected or coupled to”, “contacts or overlaps”, etc., a second element, it should be interpreted that, not only can the first element “be directly connected or coupled to” or “directly contact or overlap” the second element, but a third element can also be “interposed” between the first and second elements, or the first and second elements can “be connected or coupled to”, “contact or overlap”, etc. each other via a fourth element. Here, the second element may be included in at least one of two or more elements that “are connected or coupled to”, “contact or overlap”, etc. each other.

When time relative terms, such as “after,” “subsequent to,” “next,” “before,” and the like, are used to describe processes or operations of elements or configurations, or flows or steps in operating, processing, manufacturing methods, these terms may be used to describe non-consecutive or non-sequential processes or operations unless the term “directly” or “immediately” is also used.

In addition, when any dimensions, relative sizes etc. are described, it should be considered that numerical values for elements or features, or corresponding information (e.g., level, range, etc.) include a tolerance or error range that may be caused by various factors (e.g., process factors, internal or external impact, noise, etc.) even when a relevant description is not specified. Further, the term “may” fully encompasses all the meanings of the term “can”.

Hereinafter, various embodiments of the present disclosure will be described in detail with reference to accompanying drawings.

Figure 1:
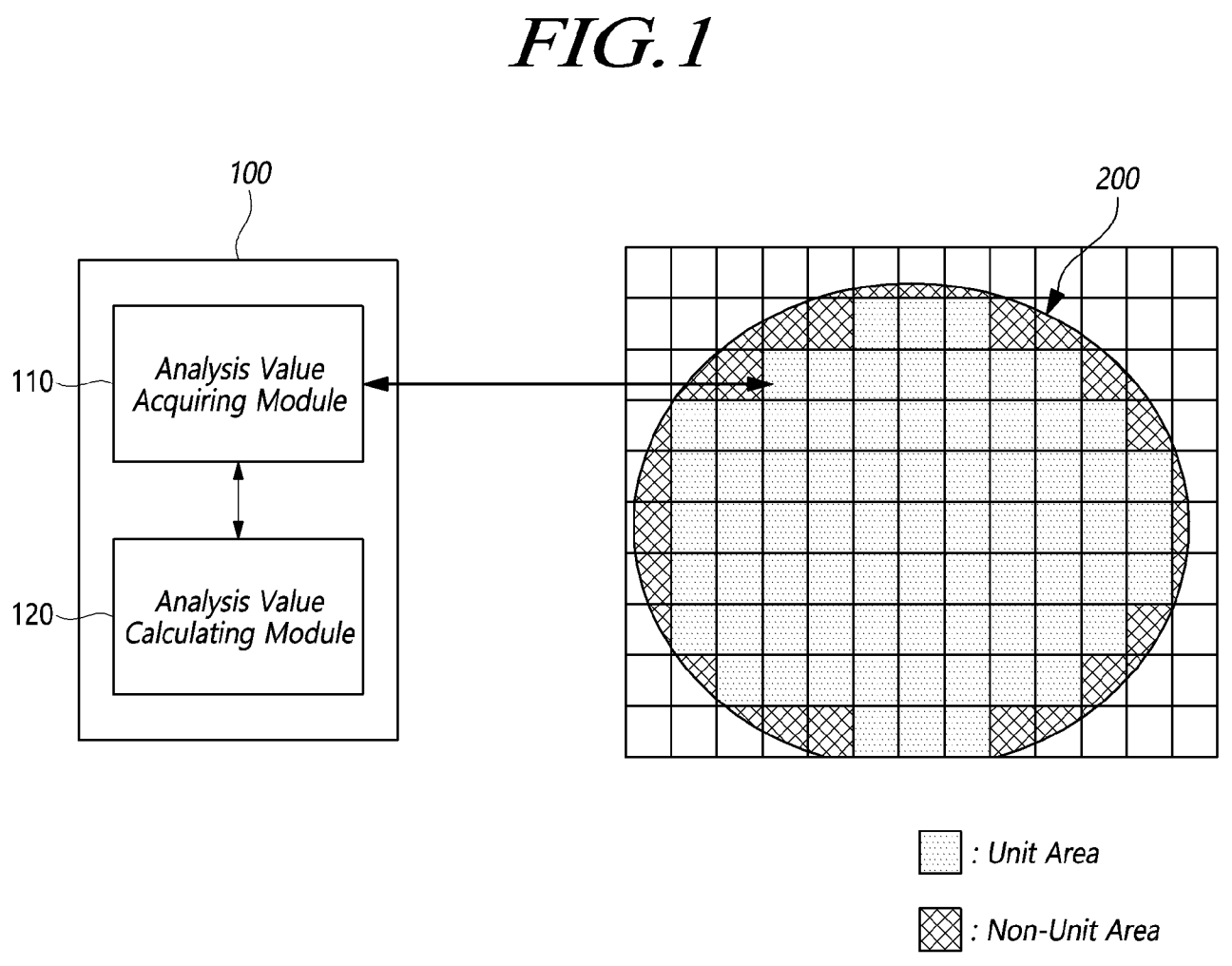

FIG. 1 is a diagram illustrating an example of a wafer analyzing device configuration according to an embodiment of the present disclosure.

Referring to FIG. 1, a wafer analyzing device 100 may include, for example, an analysis value acquiring module 110 and an analysis value calculating module 120.

The analysis value acquiring module 110 and the analysis value calculating module 120 may be implemented, for example, in module types within one device, or may be implemented as separate devices.

The analysis value acquiring module 110 may be a module or device that has an inspection function. The analysis value acquiring module 110 may acquire an inspection result value for a wafer 200. The analysis value calculating module 120 may be a module or device that has a calculation function. The analysis value calculating module 120 may calculate data that enables the analysis of the yield or defects of the wafer 200 based on an input value.

The analysis value acquiring module 110 may perform an inspection on the wafer 200. That is, the wafer 200 may be a target of inspection of the analysis value acquiring module 110. Alternatively, the analysis value acquiring module 110 may receive a result of an inspection performed by a device located outside of the wafer analyzing device 100.

The analysis value acquiring module 110 may perform inspections across a plurality of areas of the wafer 200.

For example, inspection may occur for each of a plurality of unit areas of the wafer 200 that may include an area on which a semiconductor chip is manufactured.

The unit area may be, for example, an area classified according to a process of semiconductor manufacturing performed on the wafer 200. For example, a unit area may be classified as a unit area in which a photolithography process is performed.

Each of the plurality of unit areas included in the wafer 200 may have, for example, a rectangular shape. An area that is not included in an identified rectangular shape in the wafer 200 may be a non-unit area.

The analysis value acquiring module 110 may acquire an inspection result value for each of the plurality of unit areas. For example, patterns or configurations for inspections may be located between the plurality of unit areas. As a result, the analysis value acquiring module 110 may acquire an inspection result value for each of the plurality of unit areas according to the utilization of a corresponding pattern or configuration.

The analysis value acquiring module 110 may acquire an inspection result value for a semiconductor manufactured on each unit area by performing an inspection on each of the plurality of unit areas. The inspection result value may be referred to as a measured analysis value.

In other words, the analysis value acquiring module 110 may provide, through inspections on the plurality of unit areas, measured analysis values that enable the analysis of the yield or defects in corresponding semiconductors.

Examples of types of measured analysis values include the threshold voltage of a transistor included in a semiconductor, the resistance of a metal layer, and the resistance of a metal pattern disposed in a via hole. The types of measured analysis values are not limited to those described herein, and may include any of various types of data that can be acquired through an inspection on the unit area of the wafer 200 to be used in analyzing the yield or defects in the semiconductor manufactured on the corresponding unit area.

For example, the analysis value acquiring module 110 may perform an inspection on each of the plurality of unit areas of the wafer 200, and may provide a measured analysis value for each of the plurality of unit areas. Alternatively, the analysis value acquiring module 110 may perform inspections on some unit areas, among the plurality of unit areas of the wafer 200, and may provide measured analysis values for the inspected unit areas.

The analysis value calculating module 120 may calculate an estimated analysis value for analysis of a unit area of the wafer 200 on which an inspection is not performed, based on the measured analysis values received from the analysis value acquiring module 110.

Thus, the estimated analysis value for a unit area of the wafer 200 for which a measured analysis value is not acquired may be provided by the analysis value calculating module 120. Accordingly, an analysis value for each of the plurality of unit areas of the wafer 200 may be provided in a form of a measured analysis value or an estimated analysis value, thereby reducing the number of actual inspections on the plurality of unit areas of the wafer 200. As a result, the yield or defects in semiconductors manufactured on the plurality of unit areas of the wafer 200 may be more efficiently analyzed.

The analysis value calculating module 120 may calculate an estimated analysis value using measured analysis values acquired from at least two wafers 200. In these wafers, the estimated analysis value may be used with unit areas for which a measured analysis value is not acquired.

For example, for the unit areas for which measured analysis values are not acquired, the analysis value calculating module 120 may calculate estimated analysis values, by using the measured analysis values acquired for other unit areas.

In order to calculate an estimated analysis value by the analysis value calculating module 120, the analysis value acquiring module 110 may acquire measured analysis values for unit areas included in the at least two wafers 200.

Figure 3:
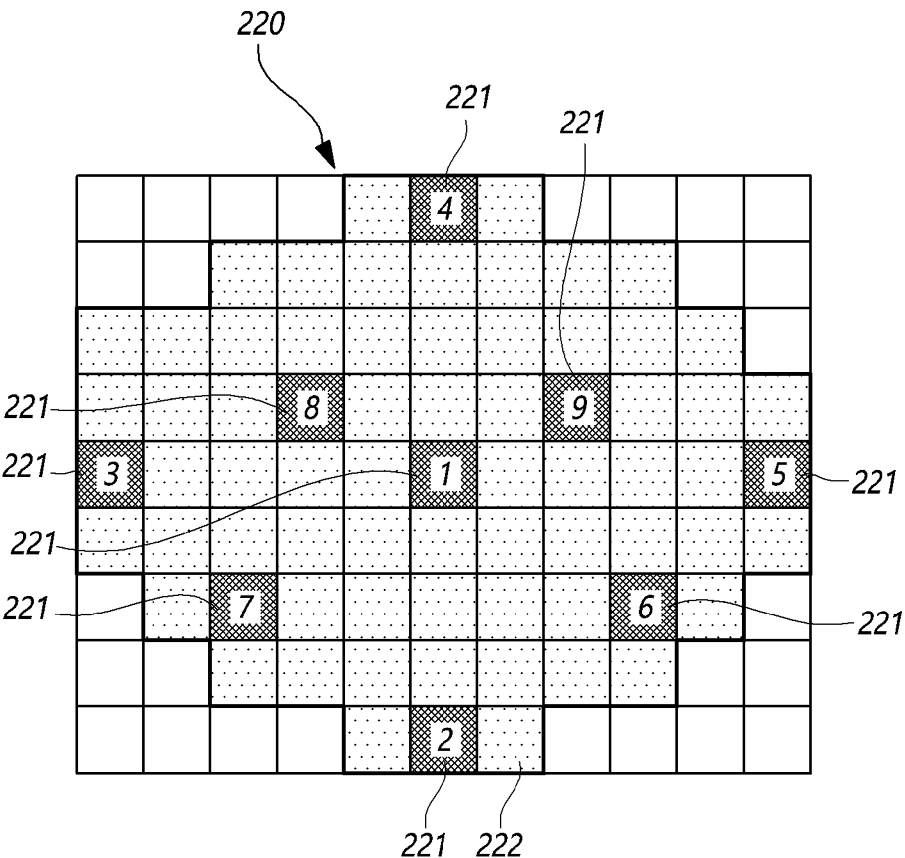
FIG. 3 is a diagram illustrating an example of a second wafer analyzed by a wafer analyzing device according to an embodiment of the present disclosure.

FIG. 2 is a diagram illustrating an example of a first wafer analyzed by a wafer analyzing device according to an embodiment of the present disclosure. FIG. 3 is a diagram illustrating an example of a second wafer analyzed by a wafer analyzing device according to an embodiment of the present disclosure.

A first wafer 210 and a second wafer 220 may be wafers 200 that are included in the same wafer lot during a manufacturing process. For example, either one of the first wafer 210 and the second wafer 220, which are in the same wafer lot, may be the first wafer 200 on which a manufacturing process is performed. Alternatively, the first wafer 210 and the second wafer 220 may be included in different wafer lots. In embodiments of the present disclosure, analysis may be performed on two different wafers 200 included in the same wafer lot or in different wafer lots.

In an example, a wafer analyzing device 100 may calculate an estimated analysis value for a unit area by using a measured analysis value acquired from the first wafer 210 and a measured analysis value acquired from the second wafer 220. In the present specification, the first wafer 210 may be referred to as a basic wafer, and the second wafer 220 may be referred to as a target wafer.

For example, referring to FIG. 2, the analysis value acquiring module 110 of the wafer analyzing device 100 may acquire measured analysis values from the first wafer 210. These measured analysis values acquired from the first wafer 210 may be referred to as first measured analysis values.

The total number of unit areas in the first wafer 210 may be referred to as basic unit areas 211. The basic unit areas 211 include an N (where N is an integer ≥2) number of unit areas. FIG. 2 illustrates as an example where N is 72, but embodiments of the present disclosure are not limited thereto.

The analysis value acquiring module 110 of the wafer analyzing device 100 may acquire measured analysis values for an N number of basic unit areas 211 included in the first wafer 210. In some embodiments, the analysis value acquiring module 110 may acquire measured analysis values for all of the basic unit areas 211 included in the first wafer 210.

The analysis value acquiring module 110 of the wafer analyzing device 100 may acquire measured analysis values for some unit areas from the second wafer 220.

For example, referring to FIG. 3, the second wafer 220 may include an N number of unit areas. The N number of unit areas included in the second wafer 220 may correspond to the N number of unit areas included in the first wafer 210.

The N number of unit areas included in the second wafer 220 may include a K number of reference unit areas 221 (where K is an integer). Out of the N number of unit areas in the second wafer 220, the unit areas that are not reference unit areas 221 (e.g., an N−K number of unit areas) may be referred to as remaining unit areas 222. The K may be an integer smaller than N and equal to or greater than 2 (N>K≥2).

The analysis value acquiring module 110 of the wafer analyzing device 100 may acquire measured analysis values from the K number of reference unit areas 221 included in the second wafer 221. The measured analysis values acquired from the reference unit areas 221 included in the second wafer 220 may be referred to as second measured analysis values.

FIG. 3 illustrates as an example where K is 9, but embodiments of the present disclosure are not limited thereto.

The K number of reference unit areas 221 may be spaced apart from each other and positioned to have at least one unit area disposed between any two of the K number of reference unit areas in the same row or column. At least one of the K number of reference unit areas 221 may be positioned adjacent to a boundary of the second wafer 220. In other words, at least one of the K number of reference unit areas 221 may be unit areas that are positioned at an edge portion of the plurality of unit areas included in the second wafer 220.

The analysis value acquiring module 110 of the wafer analyzing device 100 may not acquire measured analysis values from the remaining unit areas 222 included in the second wafer 220.

The analysis value acquiring module 110 may provide the measured analysis values acquired for the basic unit areas 211 of the first wafer 210 and the measured analysis values acquired for the reference unit areas 221 of the second wafer 220, to the analysis value calculating module 120.

The analysis value calculating module 120 may calculate estimated analysis values for the (N−K) number of the remaining unit areas 222 included in the second wafer 220, by using the measured analysis values acquired for the basic unit areas 211 from the first wafer 210 and the measured analysis values acquired for the reference unit areas 221 from the second wafer 220.

For example, the analysis value calculating module 120 may classify at least some of the (N−K) number of the remaining unit areas 222 included in the second wafer 220 into a K number of groups. The analysis value calculating module 120 may calculate estimated analysis values for each group of remaining unit areas 222.

In order to divide the remaining unit areas 222 into groups, the analysis value calculating module 120 may set the priority of each remaining unit area 222 with respect to a corresponding reference unit area 221. Then, the analysis value calculating module 120 may designate each remaining unit area 222 to be included in a certain group, based on the priority of each remaining unit area 222 with respect to the reference unit area 221.

Figure 4:
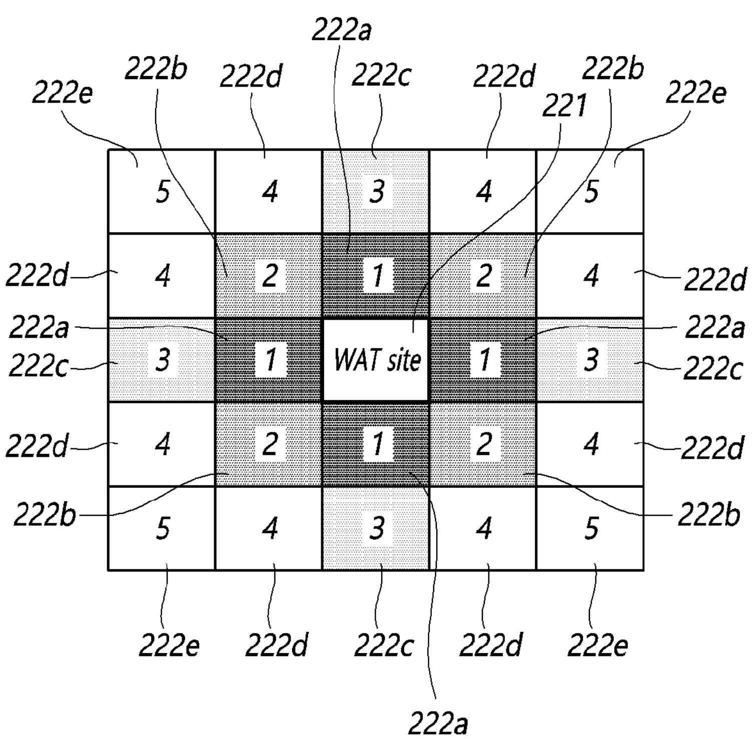
FIGS. 4 and 5 are diagrams illustrating an example of a configuration of a wafer analyzing device setting the priorities of unit areas included in the second wafer according to embodiments of the present disclosure.
Figure 5:
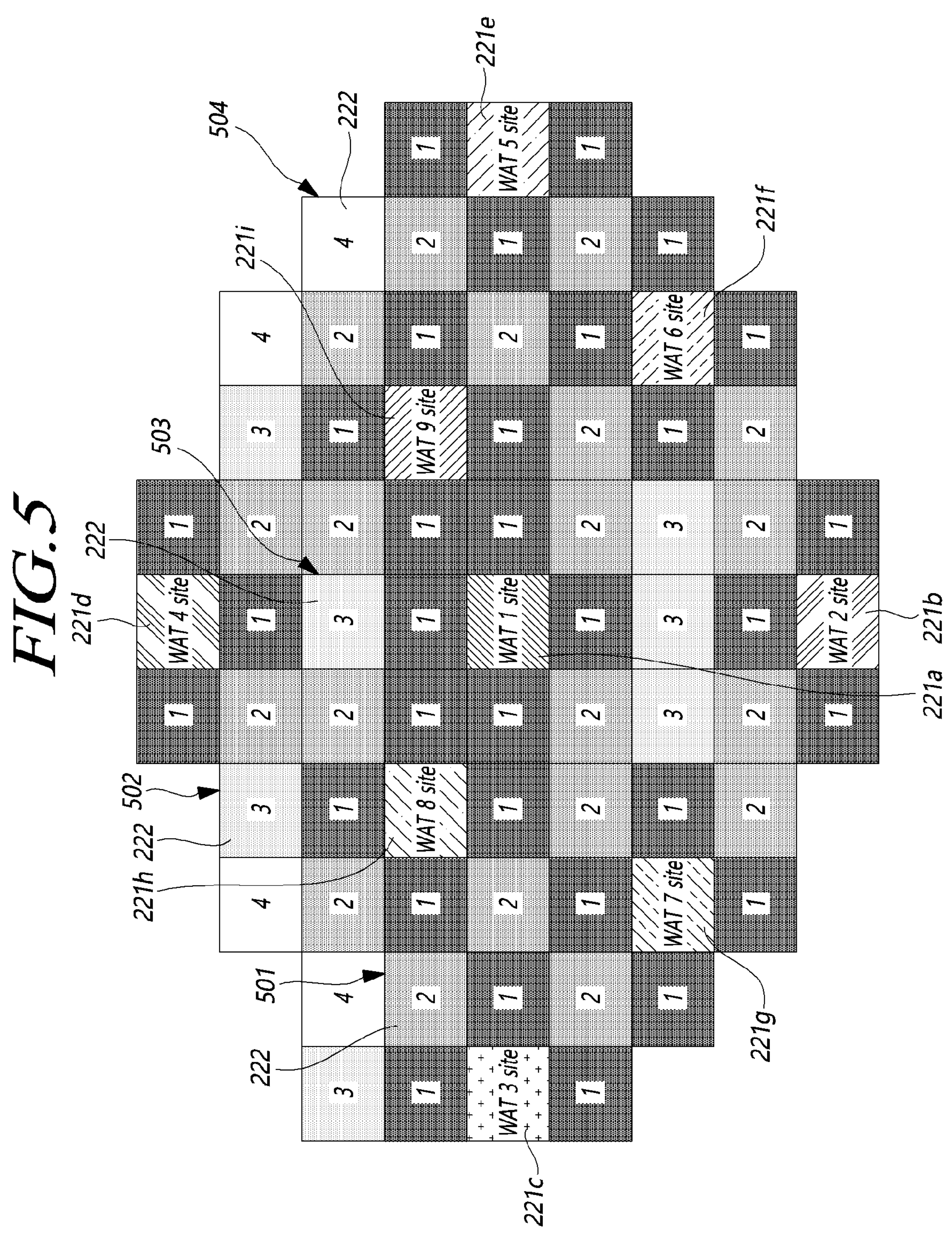
Figure 6:
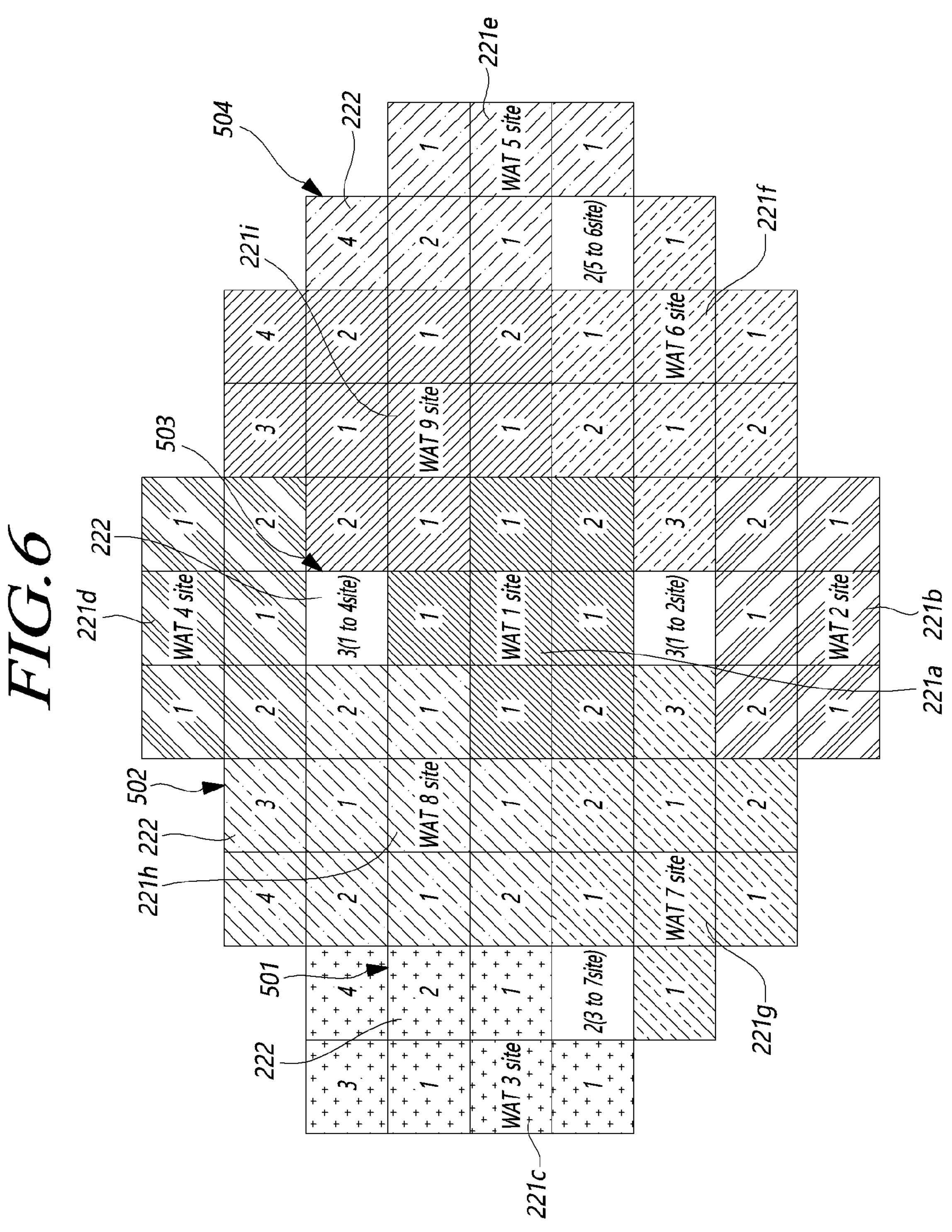
FIG. 6 is a diagram illustrating an example of a configuration of a wafer analyzing device classifying unit areas included in the second wafer into groups according to an embodiment of the present disclosure.

FIGS. 4 and 5 are diagrams illustrating an example of a configuration of a wafer analyzing device setting the priorities of unit areas included in the second wafer according to embodiments of the present disclosure. FIG. 6 is a diagram illustrating an example of a configuration of a wafer analyzing device classifying the remaining unit areas included in the second wafer 220 into groups according to an embodiment of the present disclosure.

Referring to FIGS. 3 and 4, an example of the priorities of a plurality of remaining unit areas 222 (222*a* to 222*e*) positioned around one reference unit area 221 in a second wafer 220 is illustrated. The reference unit area 221 may referred to as WAT (Wafer Acceptance Testing) site.

For example, in FIG. 4, among the remaining unit areas 222*a*, 222*b* directly surrounding the reference unit area 221, the remaining unit areas 222*a*, which are directly adjacent to the edges of the reference unit area 221, may be set to the highest priority.

The remaining unit areas 222*a* whose priority is set to the highest level may be unit areas that are closest to the reference unit area 221, or may be unit areas having common boundaries with the reference unit area 221. Thus, for example, the priorities of unit areas positioned in the same column or row as that of the reference unit area 221 may be set highest.

Among the remaining unit areas 222*a*, 222*b* that most closely surround the reference unit area 221, the remaining unit areas 222*b*, which are adjacent corners of the reference unit area 221, may be set to be the second highest priority.

For example, in FIG. 4, the remaining unit areas 222*b* whose priority is set to the second highest level may be unit areas that are positioned adjacent to the edges of the remaining unit areas 222*a* and that adjoin vertices of the reference unit area 221.

The remaining unit areas 222*a*, 222*b* that directly surround the reference unit area 221 may be referred to as first remaining unit areas. The remaining unit areas 222*c*, 222*d*, 222*e* which directly surround the first remaining unit areas may be referred to as second remaining unit areas. The priorities of the first remaining unit areas may be set to higher than the priorities of the second remaining unit areas.

Among the second remaining unit areas, the remaining unit areas 222*c*, which are positioned adjacent to the edges of the remaining unit areas 222*a*, may be set to the third highest priority.

Among the second remaining unit areas, the remaining unit areas 222*d*, which are positioned adjacent to the edges of the remaining unit areas 222*b* (whose priority is assigned the second highest level) may be set to the fourth highest priority.

The priority of the remaining unit areas 222*c*, which are adjacent to the edges of the remaining unit areas 222*a*, may be set to higher than the priority of the remaining unit areas 222*d*, which are adjacent to the edges of the remaining unit areas 222*b*.

The remaining unit areas 222*e*, which do not have edges adjacent to or meeting with the edges of any of the first remaining unit areas, may be set to the fifth highest priority.

As described above, the priorities of the remaining unit areas 222 may be set based on relative location and adjacency to the reference unit area 221 because if the edges of respective unit areas are adjacent to each other, then the characteristics of semiconductors manufactured on adjacent respective unit areas may be similar.

Thus, the priorities of the remaining unit areas 222 that are adjacent to the edges of the reference unit area 221 may be set to higher than those of outermost remaining unit areas 222 without edges adjacent to the edges of the reference unit area 221. In addition, the priorities of the innermost remaining unit areas 222 with edges or vertices adjacent to the edges of the reference unit area 221 may be set higher than those of other remaining unit areas 222 that are not adjacent thereto. The priority of the remaining unit areas 222 therefore may generally decrease with distance from the reference unit area 221.

The analysis value calculating module 120 may classify the remaining unit areas 222 into groups based on the priorities of the remaining unit areas 222.

For example, the analysis value calculating module 120 may check the priority of a remaining unit area 222 with respect to at least two reference unit areas 221. The analysis value calculating module 120 may classify a remaining unit area 222 into a group such that the remaining unit area 222 will have the highest priority with respect to the corresponding to a reference unit area 221. As between the at least two reference unit areas 221, the priority of the remaining unit area 222 will grouped to have a higher.

For example, referring to FIGS. 5 and 6, a plurality of unit areas included in a second wafer 220 may include nine reference unit areas 221.

A remaining unit area 222 that is adjacent to the edge of a first reference unit area 221*a* may have a highest priority with respect to the first reference unit area 221*a*. Since the priority with respect to the first reference unit area 221*a* is higher than the priorities with respect to the other reference unit areas 221*b* to 221*i*, the remaining unit area 222 may be classified into a group corresponding to the first reference unit area 221*a*. The remaining unit areas 222 corresponding to the first reference unit area 221*a* may be referred to as dependent unit areas of the first reference unit area 221*a*.

A remaining unit area 222 indicated in FIG. 5 by a reference numeral 501 may have a second highest priority with respect to a third reference unit area 221*c*, but may only have a third highest priority with respect to an eighth reference unit area 221*h*. Since the remaining unit area 222 indicated by reference numeral 501 has a higher priority with respect to the third reference unit area 221*c* compared to the eighth reference unit area 221*h*, this remaining unit area 222 may be classified into a group corresponding to the third reference unit area 221*c*.

Similarly, a remaining unit area 222 indicated by a reference numeral 502 in FIG. 5 may have a third highest priority with respect to the eighth reference unit area 221*h*, but may have a fourth highest priority with respect to a fourth reference unit area 221*d*. Since the corresponding remaining unit area 222 has a higher priority with respect to the eighth reference unit area 221*h* compared to the fourth reference unit area 221*d*, this remaining unit area 222 may be classified into a group corresponding to the eighth reference unit area 221*h*.

In some cases, the priorities of a remaining unit area 222 with respect to two different reference unit areas 221 may be the same.

For example, a remaining unit area 222 that is positioned in an area indicated by a reference numeral 503 in FIG. 5 may have a third highest priority with respect to the first reference unit area 221$a$ and may also have a third highest priority with respect to the fourth reference unit area 221$d$. Thus, the priority of the corresponding remaining unit area 222 may be the same with respect to the two adjacent reference unit areas 221$a$ and 221$d$. In this case, the corresponding remaining unit area 222 may be referred to as a middle unit area.

The corresponding remaining unit area 222 may not be included in either the group including the first reference unit area 221$a$ or the group including the fourth reference unit area 221$d$. Instead, this middle unit area, which is not included in a group configured by a reference unit area 221, may be referred to as a neutral unit area. An estimated analysis value for the neutral unit area may be calculated by a separate method.

In other embodiments, however, the middle unit area may be included in a group including a reference unit area 221.

For example, a remaining unit area 222 indicated by a reference numeral 504 in FIG. 5 may have a fourth highest priority with respect to a fifth reference unit area 221$e$ and may also have a fourth highest priority with respect to a ninth reference unit area 221$i$. Thus, the priority of the corresponding remaining unit area 222 may be the same with respect to the two adjacent reference unit areas 221$e$ and 221$i$. As described above, this corresponding remaining unit area 222 may be referred to as a middle unit area.

In FIG. 5, the middle unit area may be adjacent to the boundary of the second wafer 220 or positioned at an edge portion of the plurality of unit areas. In addition, the fifth reference unit area 221$e$ is also positioned at an edge portion of the plurality of unit areas, but the ninth reference unit area 221$i$ is not.

In this case, when the middle unit area is a unit area that is positioned at the edge portion of the plurality of unit areas, the middle unit area may be classified into a group corresponding to the reference unit area 221 that is also positioned at the edge portion of the plurality of unit areas 221.

For example, as between the fifth reference unit area 221$e$ and the ninth reference unit area 221$i$, the fifth reference unit area 221$e$ is a unit area that is positioned at the edge portion of the plurality of unit areas.

Thus, the remaining unit area 222 that is a middle unit area 504 positioned at the edge portion of the plurality of unit areas may be classified into a group including the fifth reference unit area 221$e$, which is also positioned at the edge portion of the plurality of unit areas. Since unit areas positioned at the edge portion of the second wafer 220 may have similar characteristics, even when a remaining unit area 222 is a middle unit area, the remaining unit area 222 may be classified into a dependent unit area of a reference unit area 221 that is positioned at the edge portion.

Using the method described above, at least some of the plurality of remaining unit areas 222 included in the second wafer 220 may be classified into nine groups according to the nine reference unit areas 221. Some of the plurality of remaining unit areas 222 may be classified into neutral unit areas.

Then, offset values may be set to calculate estimated analysis values for the remaining unit areas 222 classified into the groups and the remaining unit areas 222 classified into the neutral unit areas.

Figure 7:
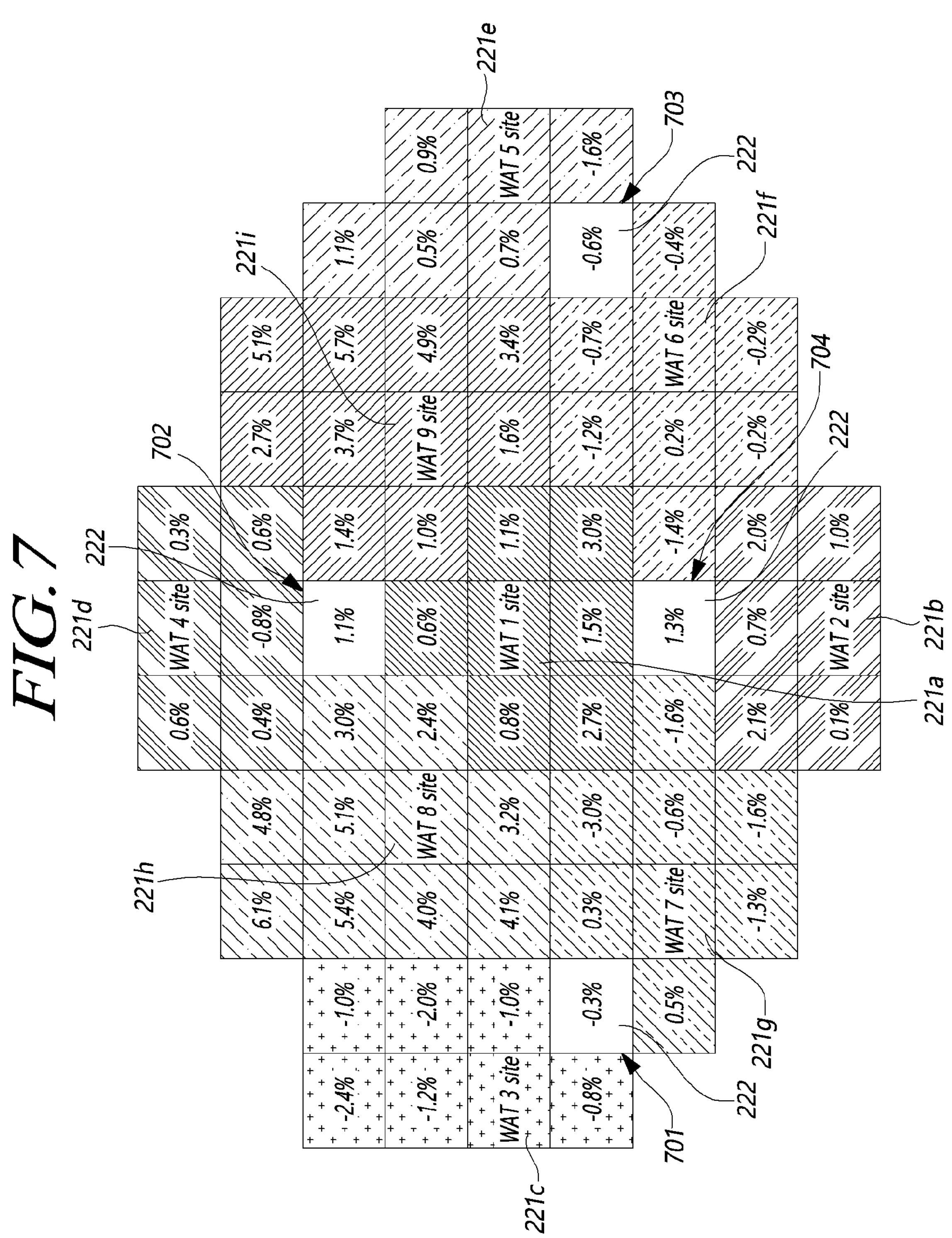
FIG. 7 is a diagram illustrating an example of a configuration of a wafer analyzing device setting offset values to the remaining unit areas included in the second wafer according to an embodiment of the present disclosure.

FIG. 7 is a diagram illustrating an example of a configuration of a wafer analyzing device setting offset values to remaining unit areas included in the second wafer according to an embodiment of the present disclosure.

Referring to FIG. 7, an analysis value calculating module 120 may determine an offset value for each of the remaining unit areas 222 of the second wafer 220 by using a ratio between measured analysis values acquired from the first wafer 210. In embodiments, the unit areas of the first wafer 210 have a one-to-one correspondence with unit areas of the second wafer 220.

For example, the analysis value calculating module 120 may respectively acquire measured analysis values for the basic unit areas 211 included in the first wafer 210. The analysis value calculating module 120 may divide the basic unit areas 211 into groups corresponding to dependent unit areas of each reference unit area in the second wafer 220. The analysis value calculating module 120 may respectively check ratios among grouped measured analysis values for the basic unit areas 211 included in the first wafer 210.

The analysis value calculating module 120 may set an offset value of a selected remaining unit area 222 included in a group of the second wafer 220 by using a ratio between measured analysis values of basic unit areas 211 included in a group of the first wafer 210 corresponding to the group of the second wafer 220 that includes the selected remaining unit area 222.

For example, referring to FIG. 7, the analysis value calculating module 120 may check a ratio between the measured analysis value of the basic unit area 211 of the first wafer 210 corresponding to the fourth reference unit area 221$d$ of the second wafer 220 and the measured analysis value of the basic unit area 211 of the first wafer 210 corresponding to the remaining unit area 222 positioned immediately to the left of the fourth reference unit area 221$d$ of the second wafer 220.

A unit area of the second wafer 220 and a corresponding unit area of the first wafer 210 may be areas that are positioned at the same position and overlap with each other if the first wafer 210 and the second wafer 220 overlap with each other. The unit area of the second wafer 220 and the corresponding unit area of the first wafer 210 may be areas where the same or a similar manufacturing process is performed when processes on the first wafer 210 and the second wafer 220 are performed.

A ratio between the measured analysis value of the basic unit area 211 of the first wafer 210 corresponding to the fourth reference unit area 221$d$ of the second wafer 220 and the measured analysis value of the basic unit area 211 of the first wafer 210 corresponding to the remaining unit area 222 positioned on the left side of the fourth reference unit area 221$d$ of the second wafer 220 may be, for example, 1.006.

In this case, as illustrated in FIG. 7, the offset value for the remaining unit area 222 positioned on the left side of the fourth reference unit area 221$d$ may be set to 1.006 or 0.6%. The estimated analysis value of a remaining unit area 222 is therefore calculated using the offset value set for the remaining unit area 222, and the offset value is determined using the measured analysis value for a reference unit area 221 corresponding to remaining unit area 222.

The unit areas of the first wafer 210 and the second wafer 220 are subject to substantially the same manufacturing processes. Therefore, measured analysis values for unit areas of the second wafer 220 may be substantially similar to the measured analysis values for corresponding unit areas of the first wafer 210. Thus, by using methods described above, estimated analysis values with high accuracy may be acquired for the remaining unit areas 222 of the second wafer 220, such that measured analysis values are not required for the remaining unit areas of the second wafer 220.

The offset value for a neutral unit area, which is not included in a group among the remaining unit areas 222 of the second wafer 220, may be set as the average of offset values with respect to two adjacent reference unit areas 221.

For example, the offset value of a neutral unit area may be set as the average of a ratio of the measured analysis value of a unit area of the first wafer 210 corresponding to a reference unit area 221 adjacent to the neutral unit area, and a ratio of the measured analysis value of a unit area of the first wafer 210 corresponding to a different reference unit area 221 adjacent to the neutral unit area.

For example, in FIG. 7, the offset value of a neutral unit area that is positioned in an area indicated by a reference numeral 701 may be the average of an offset value of the third reference unit area 221*c* and an offset value of a seventh reference unit area 221*g*.

Similarly, the offset value of a neutral unit area that is positioned in an area indicated by a reference numeral 702 may be the average of an offset value of the first reference unit area 221*a* and an offset value of the fourth reference unit area 221*d*. The offset value of a neutral unit area that is positioned in an area indicated by a reference numeral 703 and the offset value of a neutral unit area that is positioned in an area indicated by a reference numeral 704 may also be similarly set.

In another example, a ratio between the measured analysis value of a unit area of the first wafer 210 corresponding to a neutral unit area of the second wafer 220, and the average of a measured analysis value of a unit area of the first wafer 210 corresponding to a reference unit area 221 adjacent to the neutral unit area and the measured analysis value of another unit area of the first wafer 210 corresponding to a different reference unit area 221 adjacent to the neutral unit area, may be set as the offset value of the neutral unit area.

For example, referring to FIG. 7, the offset value of a neutral unit area that is positioned in the area indicated by the reference numeral 701, is a ratio between the measured analysis value of a unit area of the first wafer 210 corresponding to the neutral unit area, and the average of a measured analysis value of a unit area of the first wafer 210 corresponding to the third reference unit area 221*c* and a measured analysis value of a unit area of the first wafer 210 corresponding to the seventh reference unit area 221*g*.

The analysis value calculating module 120 may calculate the estimated analysis value of a remaining unit area 222 using an offset value acquired for the corresponding remaining unit area 222 and a measured analysis value acquired for a reference unit area 221.

Figure 8:
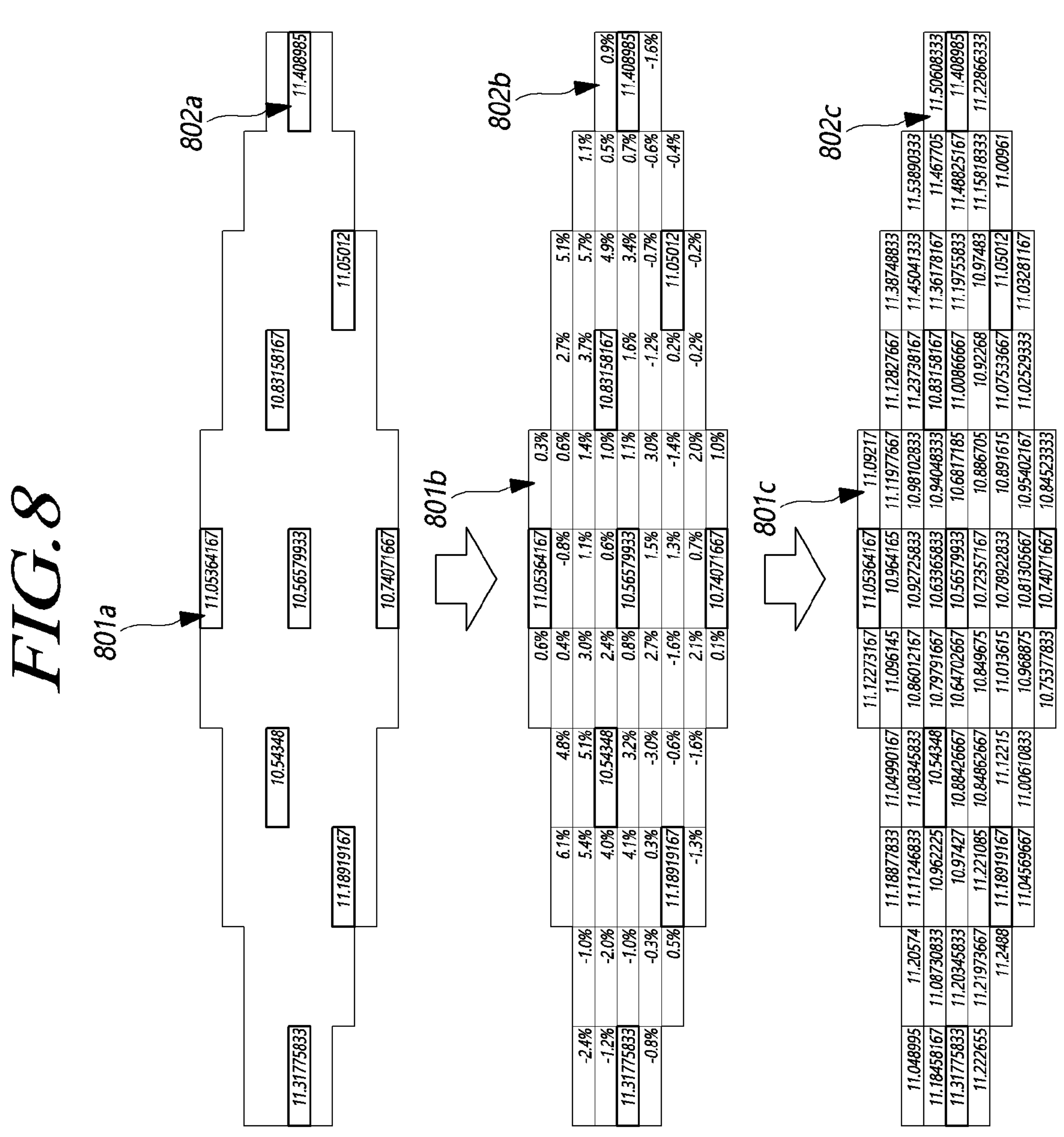
FIG. 8 is a diagram illustrating an example of a configuration of a wafer analyzing device calculating the estimated analysis values of the remaining unit areas included in the second wafer according to an embodiment of the present disclosure.

FIG. 8 is a diagram illustrating an example of a configuration of a wafer analyzing device calculating the estimated analysis values of the remaining unit areas included in the second wafer according to an embodiment of the present disclosure.

Referring to FIGS. 7 and 8, an example of measured analysis values acquired for nine reference unit areas 221*a* through 221*i* in a second wafer 220 is shown.

For example, referring to a diagram at the top of FIG. 8, a portion indicated by a reference numeral 801*a* represents a measured analysis value for the fourth reference unit area 221*d* included in the second wafer 220. A portion indicated by a reference numeral 802*a* represents a measured analysis value for the fifth reference unit area 221*e* included in the second wafer 220.

Then, offset values for the remaining unit areas 222, other than the reference unit areas 221, may be set.

For example, referring to a diagram at the center of FIG. 8, a portion indicated by a reference numeral 801*b* represents an offset value set for the remaining unit area 222 that is positioned on the right side of the fourth reference unit area 221*d*. A portion indicated by a reference numeral 802*b* represents an offset value set for the remaining unit area 222 that is positioned on the upper side of the fifth reference unit area 221*e*.

As described above, an offset value for each remaining unit area 222 may be set based on a ratio between measured analysis values acquired from basic unit areas 211 included in each group of the first wafer 210 corresponding to each group of the second wafer 220 that includes the corresponding remaining unit area.

Then, by using the measured analysis value acquired for the reference unit area 221 of the second wafer 220 and the offset value set for a remaining unit area 222, the analysis value calculating module 120 may calculate an estimated analysis value for the remaining unit area 222.

For example, referring to a diagram at the bottom of FIG. 8, a portion indicated by a reference numeral 801*c* represents an estimated analysis value calculated for the remaining unit area 222 that is positioned on the right side of the fourth reference unit area 221*d*.

As an offset value of 0.3% set for the remaining unit area 222 positioned on the right side of the fourth reference unit area 221*d* is applied to a measured analysis value of 11.05364167 for the fourth reference unit area 221*d*, the estimated analysis value for the corresponding remaining unit area 222 may be calculated as 11.09217.

In addition, a portion indicated by a reference numeral 802*c* represents an estimated analysis value calculated for the remaining unit area 222 that is positioned on the upper side of the fifth reference unit area 221*e*.

As an offset value of 0.9% set for the remaining unit area 222 positioned on the upper side of the fifth reference unit area 221*e* is applied to a measured analysis value of 11.408985 for the fifth reference unit area 221*e*, the estimated analysis value for the corresponding remaining unit area 222 may be calculated as 11.50608333.

In this way, by using measured analysis values acquired in some unit areas, such as reference unit areas, included in the second wafer 220 and offset values acquired based on measured analysis values of all unit areas included in the first wafer 210, estimated analysis values for remaining unit areas 222 included in each group of the second wafer 220 may be provided.

As described above, an estimated analysis value for a neutral unit area not included in each group may be calculated using an offset value set for the neutral unit area.

Alternatively, an estimated analysis value or an offset value for a neutral unit area may be calculated using the measured or estimated analysis values or offset values of unit areas surrounding the neutral unit area and linear regression analysis.

Figure 9:
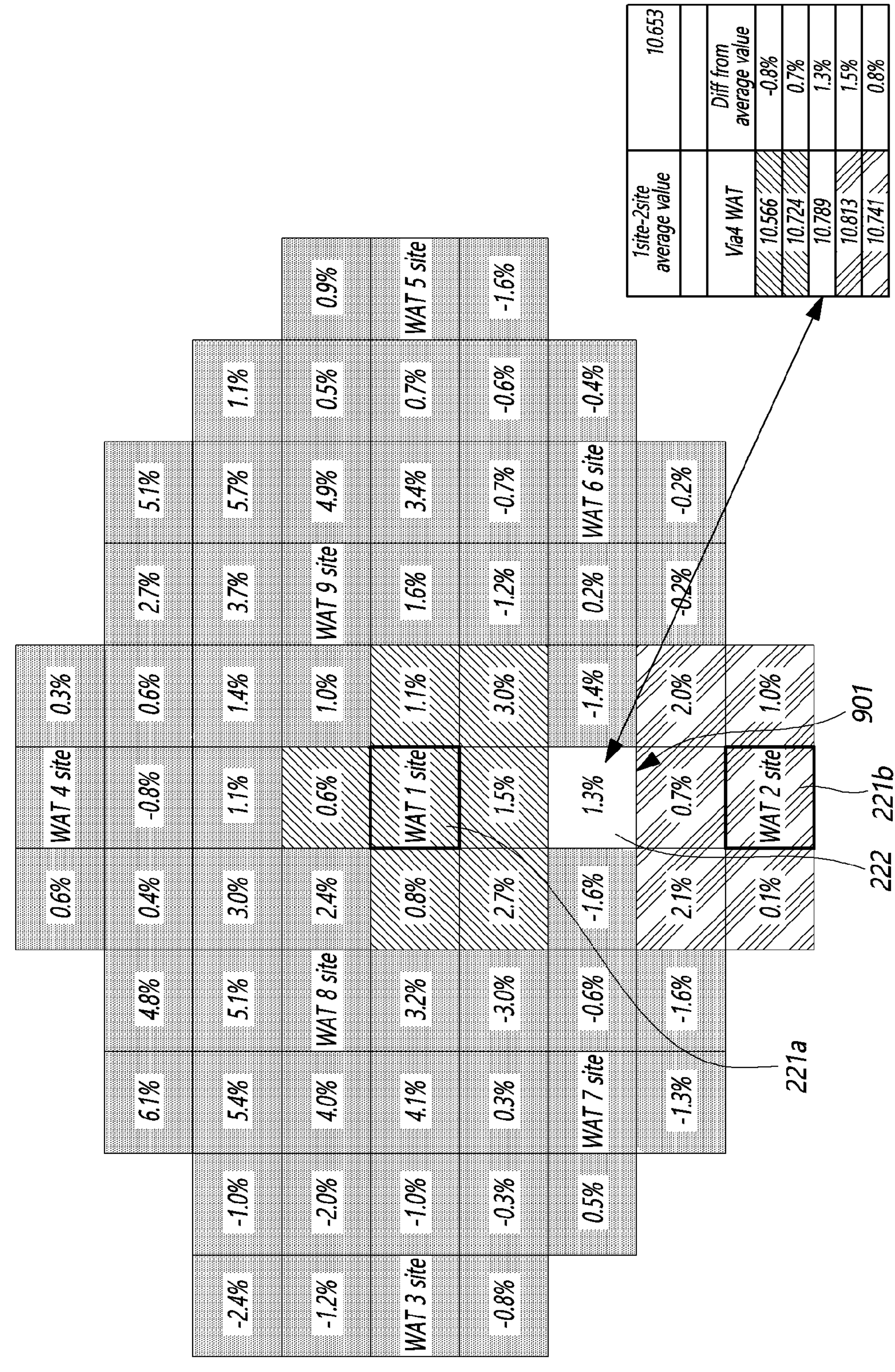
FIG. 9 is a diagram illustrating an example of another configuration of a wafer analyzing device setting the offset value of a middle unit area included in a second wafer according to an embodiment of the present disclosure.

FIG. 9 is a diagram illustrating an example of another configuration of a wafer analyzing device setting the offset value of a middle unit area included in a second wafer according to an embodiment of the present disclosure.

Referring to FIG. 9, a neutral unit area that is positioned in an area indicated by a reference numeral 901 may be a unit area whose priority with respect to a first reference unit area 221*a* and priority with respect to a second reference unit area 221*b* are the same.

As described above, an offset value for the neutral unit area may be the average of an offset value assuming the neutral unit area is a dependent unit area of the first reference unit area 221$a$ and another offset value assuming the neutral unit area is a dependent unit area of the second reference unit area 221$b$.

Alternatively, an offset value for the neutral unit area may be set according to linear regression analysis of offset values of unit areas positioned around the neutral unit area. For example, linear regression analysis may be performed on offset values and measured or estimated analysis values of unit areas disposed in the same column as the neutral unit area.

According to the linear regression analysis, a relational equation between the measured or estimated analysis value and the offset value of a unit area disposed in the same column may be derived. For example, the relational equation may be derived as $Y=ax+b$, where Y is the offset value of the neutral unit area, X is the measured or estimated analysis value of the neutral unit area, (a) is a slope, and (b) is a y-intercept.

In an example shown in FIG. 9, a linear regression analysis equation may be derived using a measured analysis value and an offset value (X1, Y1) for the first reference unit area 221$a$, a measured analysis value and an offset value (X2, Y2) for the second reference unit area 221$b$, an estimated analysis value and an offset value (X3, Y3) of a remaining unit area 222 positioned between the first reference unit area 221$a$ and the neutral unit area, and an estimated analysis value and an offset value (X4, Y4) of a remaining unit area 222 positioned between the second reference unit area 221$b$ and the neutral unit area.

In the example of FIG. 9, the linear regression analysis equation may be calculated as, for example, $Y=9.38679979X-100$.

The offset value or the estimated analysis value of the neutral unit area may be obtained through the above equation.

In this way, the offset value or the estimated analysis value of the neutral unit area may be calculated using the linear regression analysis, and the linear regression analysis may be used in calculating analysis values for some unit areas, such as neutral unit areas, for which analysis values are not acquired.

For example, measured analysis values may not be acquired for all of the unit areas included in the first wafer 210. Specifically, measured analysis values may be acquired only for a P number of unit areas among the N number of unit areas included in the first wafer 210. P may be an integer smaller than or equal to N and P may be greater than K, which is the number of reference unit areas 221 with measured analysis values in the second wafer 220.

The analysis value calculating module 120 may calculate estimated analysis values for (N−P) number of unit areas in the first wafer 210 for which measured analysis values are not acquired, using measured analysis values and linear regression analysis for the P number of unit areas. The analysis value calculating module 120 may also derive, through linear regression analysis, estimated analysis values for all unit areas in the first wafer 210, even when measured analysis values are acquired for some unit areas.

When only a P number of measured analysis values are acquired for the first wafer 210, the analysis value calculating module 120 may calculate, based on the P number of measured analysis values, estimated analysis values for the second wafer 220 in which K, smaller than P, number of measured analysis values are acquired.

An embodiment of the present disclosure may provide measures capable of detecting the cause of a defect by analyzing the correlation between an analysis value provided by the wafer analyzing device 100 and a defect percentage acquired as a result of a test.

Figure 10:
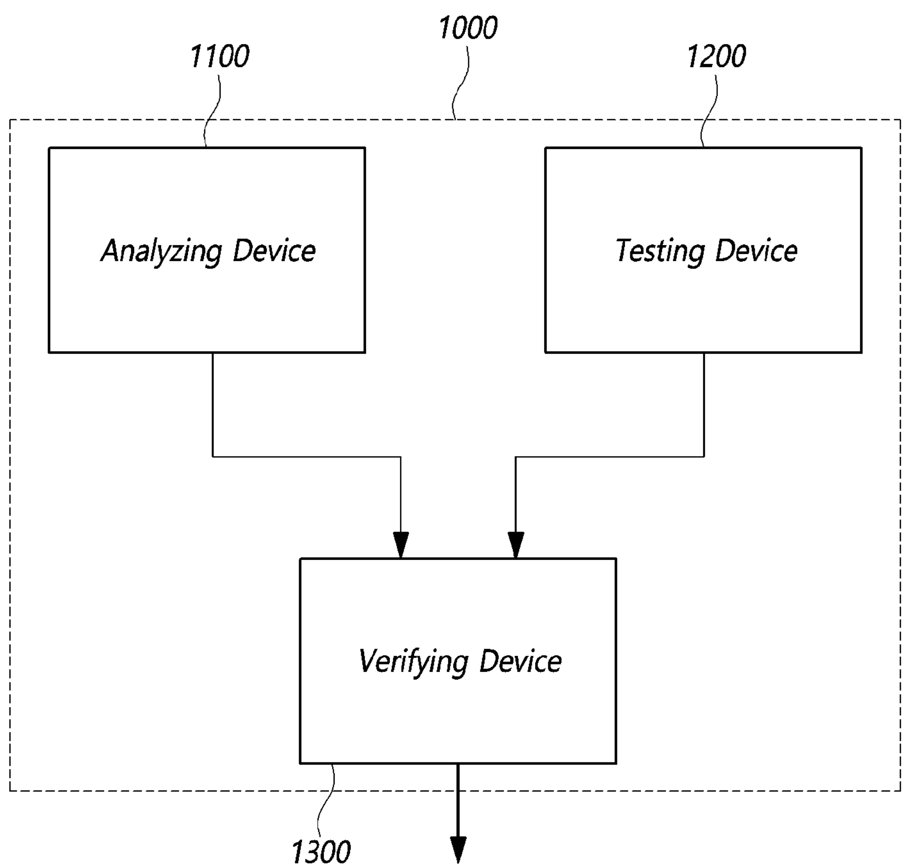
FIG. 10 is a diagram illustrating an example of a configuration of a wafer analyzing system according to an embodiment of the present disclosure.
Figure 11:
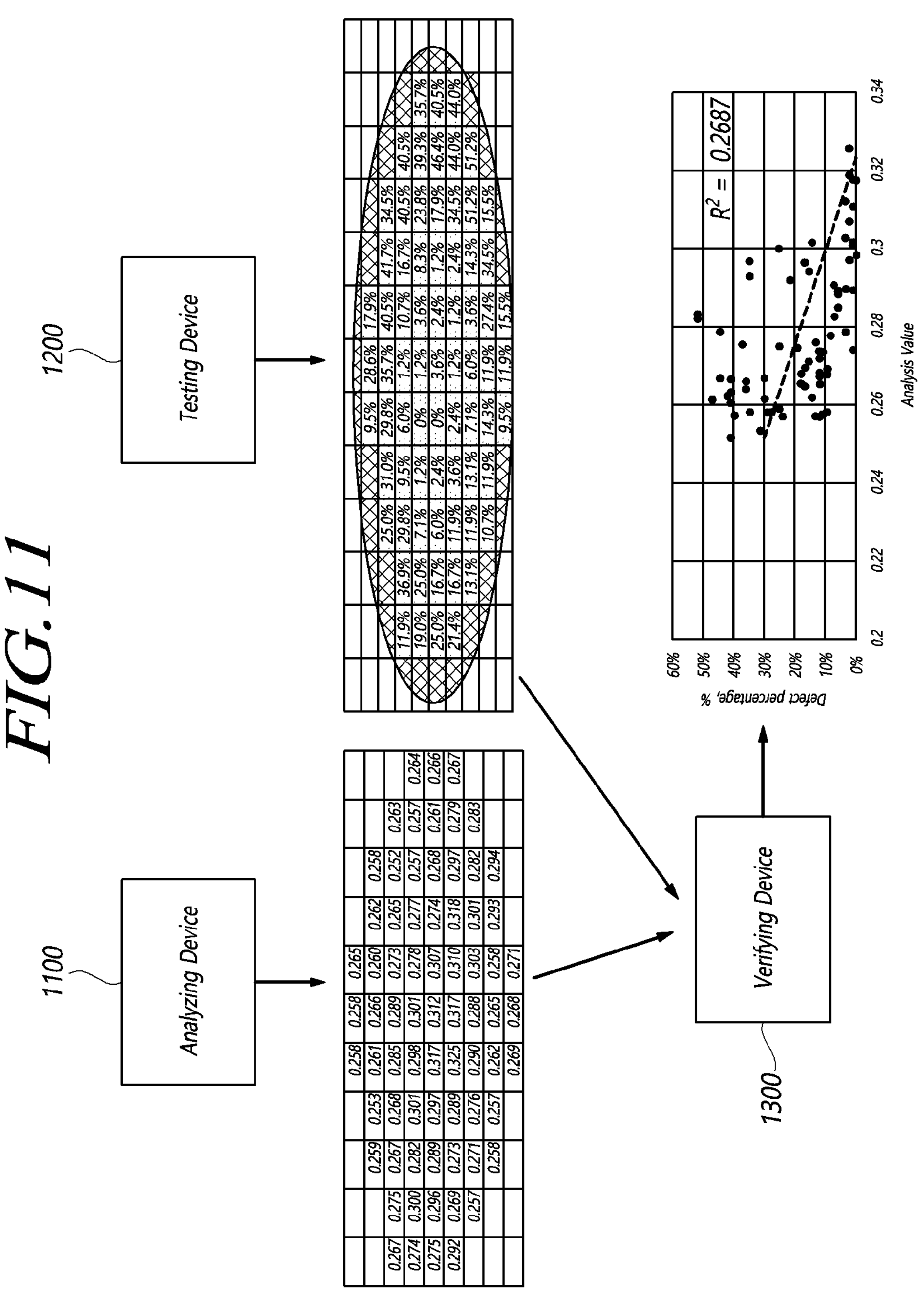
FIG. 11 is a diagram illustrating an example of a configuration of a wafer analyzing system extracting the cause of a defect according to an embodiment of the present disclosure.

FIG. 10 is a diagram illustrating an example of a configuration of a wafer analyzing system according to an embodiment of the present disclosure. FIG. 11 is a diagram illustrating an example of a configuration of a wafer analyzing system extracting the cause of a defect according to an embodiment of the present disclosure.

Referring to FIGS. 10 and 11, a wafer analyzing system 1000 according to an embodiment of the present disclosure may include, for example, an analyzing device 1100, a testing device 1200, and a verifying device 1300. For example, each of the analyzing device 1100, the testing device 1200 and the verifying device 1300 may include a processor. Each of them may include at least one memory. In some cases, two or more processors of them may be implemented as integrated type. Two or more of them may share the at least one memory. And at least one of them may include a display for displaying a result of analyzing, testing or verifying.

The analyzing device 1100 may be the same as the wafer analyzing device 100 described above. Alternatively, the analyzing device 1100 may include only a partial configuration of the wafer analyzing device 100 described above.

For example, the analyzing device 1100 may acquire and provide measured analysis values for all unit areas of the wafer 200 through measurement. In some embodiments, the analyzing device 1100 may not include a configuration that calculates an estimated analysis value based on a measured analysis value.

Alternatively, the analyzing device 1100 may provide both a measured analysis value and an estimated analysis value in the same manner as the wafer analyzing device 100 described above.

The analyzing device 1100 may provide analysis values for all the unit areas of the wafer 200 to the verifying device 1300. The analysis values may include only measured analysis values, or may include measured analysis values and estimated analysis values.

For example, analysis values provided by the analyzing device 1100 are illustrated in an example shown in FIG. 11. As described above, the analysis values provided by the analyzing device 1100 may be values representing electrical characteristics on threshold voltage, metal resistance, via hole resistance, and others (e.g., Wafer Acceptance Testing (WAT), Electrical Parameter Monitoring (EPM), Process Control Monitoring (PCM).

The testing device 1200 may perform a test on each unit area of the wafer 200, and may provide a defect percentage according to the test. For example, the testing device 1200 may provide the yield or defect percentage of each unit area of the wafer 200 on which a photolithography process is performed. A yield or defect percentage according to a test may be provided for each photo shot unit.

The testing device 1200 may test the performance of a semiconductor manufactured on each unit area. For example, the testing device 1200 may perform a test based on a maximum limit value or a minimum limit value of a voltage for the operation of a semiconductor. The testing device 1200 may perform the test using the corresponding voltages, and may provide a percentage of defects. Then, the testing device 1200 may provide, to the verifying device 1300, data for the percentage of defects as a result of the test on the semiconductor manufactured on each unit area.

An example of defect percentages for respective unit areas provided by the testing device 1200 may be as shown in FIG. 11.

The verifying device 1300 may derive a correlation between an analysis value provided from the analyzing device 1100 and a defect percentage provided from the testing device 1200.

The verifying device 1300 may check whether the target of the corresponding analysis value corresponds to the cause of a defect, according to the correlation between the analysis value and the defect percentage.

For example, if there is a correlation between an analysis value and a defect percentage, a tendency such as a constant slope may appear as in the graph shown in FIG. 11. Alternatively, if there is no correlation between an analysis value and a defective percentage, a tendency such as a constant slope may not appear (e.g., may be parallel to the X-axis or close to parallel to the X-axis). The verifying device 1300 may express the correlation as a numerical value such as $R^2$, and may determine that the higher the numerical value $R^2$ is, the higher a correlation is.

On the basis of whether a correlation between an analysis value and a defect percentage exists, the verifying device 1300 may verify whether a defect, which is indicative of the defect percentage, is attributed to a parameter that corresponds to the analysis value.

For example, the verifying device 1300 may verify whether the cause of the defect percentage, in each unit area, is the threshold voltage of a transistor, the resistance of a metal layer, or the resistance of a metal pattern disposed in a via hole.

Since the cause of a defect may be verified based on a correlation between an analysis value and a defect percentage, it is possible to prevent a defect of a semiconductor manufactured on the wafer 200 and improve the yield.

Although various embodiments of the present disclosure have been described with particular specifics and varying details for illustrative purposes, those skilled in the art will appreciate that various modifications, additions and substitutions may be made based on what is disclosed or illustrated in the present disclosure without departing from the spirit and scope of the present disclosure as defined in the following claims.

What is claimed is:

1. A wafer analyzing device comprising:

an analysis value acquiring module configured to obtain first measured analysis values for an integer N number of unit areas included in a first wafer, and to obtain second measured analysis values for an integer K number of reference unit areas, from among an N number of unit areas included in a second wafer, wherein $N>K\geq 2$; and an analysis value calculating module configured to classify a plurality of remaining unit areas included in the second wafer, wherein the plurality of remaining unit areas includes up to an (N−K) number and excludes the K number of reference unit areas, into a K number of groups, and configured to calculate an estimated analysis value for each of the up to (N−K) number of the plurality of remaining unit areas using the first measured analysis values for the integer N number of unit areas from the first wafer and the second measured analysis values for an integer K number of reference unit areas from the second wafer.

2. The wafer analyzing device of claim 1, wherein the analysis value calculating module calculates the estimated analysis value for each of the up to (N−K) number of the plurality of remaining unit areas using the second measured analysis values of the reference unit areas, each of which is included in a corresponding one of the K number of groups, and a ratio between the first measured analysis values of the unit areas included in the first wafer that correspond to the reference unit area and the remaining unit areas included in each of the K number of groups.

3. The wafer analyzing device of claim 1, wherein, for each of the K number of reference unit areas, the analysis value calculating module sets a priority for each of the plurality of remaining unit areas based on a positional relationship between the reference unit area and the remaining unit area.

4. The wafer analyzing device of claim 3, wherein the analysis value calculating module assigns a higher priority to a remaining unit area adjacent to an edge of a reference unit area compared to a remaining unit area that is not adjacent to the edge of the reference unit area.

5. The wafer analyzing device of claim 3, wherein the analysis value calculating module assigns a higher priority to a remaining unit area in the same row or column as the reference unit area compared to a remaining unit area that is not positioned in the same row or column as the reference unit area.

6. The wafer analyzing device of claim 3, wherein the analysis value calculating module assigns higher priorities to first remaining unit areas that directly surround the reference unit area than to second remaining unit areas that surround the first remaining unit areas but do not directly surround the reference unit area.

7. The wafer analyzing device of claim 6, wherein the analysis value calculating module assigns a higher second priority to a second remaining unit area that is adjacent to a first remaining unit area with a higher first priority and assigns a lower second priority to another second remaining unit area that is adjacent to another first remaining unit area with a lower first priority.

8. The wafer analyzing device of claim 3, wherein at least some of the plurality of remaining unit areas are grouped as dependent unit areas of a reference unit areas according to the highest priority of the remaining unit area relative to each reference unit area.

9. The wafer analyzing device of claim 8, wherein the analysis value calculating module sets an offset value of a dependent unit area based on a ratio between the first measured analysis value of unit area in the first wafer corresponding to the reference unit area in the second wafer, and the first measured analysis value of unit area in the first wafer corresponding to the dependent unit area in the second wafer.

10. The wafer analyzing device of claim 9, wherein the analysis value calculating module calculates the estimated analysis value of the dependent unit area based on the second measured analysis value of the reference unit area and the offset value of the dependent unit area.

11. The wafer analyzing device of claim 3, wherein at least one of the plurality of remaining unit areas is a middle unit area having the same priority with respect to at least two reference unit areas.

12. The wafer analyzing device of claim 11, wherein the analysis value calculating module sets an offset value of the middle unit area in the second wafer based on an average of ratios between the first measured analysis value of the unit area in the first wafer corresponding to the middle unit area, and each of the first measured analysis values of unit areas corresponding to the at least two reference unit areas.

13. The wafer analyzing device of claim 11, wherein the analysis value calculating module sets an offset value of the middle unit area according to linear regression analysis using the first measured analysis values of at least two unit areas positioned around the unit area of the first wafer corresponding to the middle unit area.

14. The wafer analyzing device of claim 11, wherein the analysis value calculating module sets the middle unit area as a dependent unit area of the reference unit area of the at least two reference unit areas that is positioned at an edge portion when the middle unit area is positioned at an edge portion of the N number of unit areas.

15. The wafer analyzing device of claim 1, wherein the K number of reference unit areas are not adjacent to each other and arranged to have at least one remaining unit area that is disposed between any two of the K number of reference unit areas.

16. The wafer analyzing device of claim 1, wherein one of the K number of reference unit areas is adjacent to a boundary of the second wafer.

17. A wafer analyzing device comprising:

an analysis value acquiring module configured to acquire an integer P number of first measured analysis values for a P number of unit areas from among an integer N number of unit areas included in a first wafer, and to acquire an integer K number of second measured analysis values of a K number of unit areas from among an N number of unit areas included in a second wafer, wherein $N \geq P \geq 2$ and $P > K$; and an analysis value calculating module configured to calculate an estimated analysis value for each of an $(N-K)$ number of unit areas in the second wafer, excluding the K number of unit areas having measured analysis values, based on the P number of first measured analysis values from the first wafer and the K number of second measured analysis values from the second wafer.

18. A wafer analyzing system comprising:

an analyzing device configured to provide an analysis value for each of an N number of unit areas included in a target wafer;

a testing device configured to perform a test on a plurality of semiconductor chips disposed respectively on the N number of unit areas included in the target wafer, and to provide a defect percentage for each of the N number of unit areas included in the target wafer according to the tests; and a verifying device configured to extract a cause of a defect associated with the tests based on a correlation between the analysis value of each of the N number of unit areas in the target wafer and the defect percentage of each of the N number of unit areas in the target wafer.

19. The wafer analyzing system of claim 18, wherein some of the analysis values of the N number of unit areas are measured analysis values and some are estimated analysis values.

20. The wafer analyzing system of claim 18, wherein the analyzing device acquires first measured analysis values of an integer N number of unit areas included in a basic wafer, acquires second measured analysis values of an integer K number of reference unit areas from among the N number of unit areas included in the target wafer, and provides an estimated analysis value for each of an $(N-K)$ number of remaining unit areas, excluding the K number of reference unit areas, using the first measured analysis values and the second measured analysis values, wherein $N > K \geq 2$.

* * * * *